US010978433B2

(12) United States Patent
Hsiao et al.

(10) Patent No.: US 10,978,433 B2
(45) Date of Patent: *Apr. 13, 2021

(54) PACKAGE-ON-PACKAGE (POP) DEVICE WITH INTEGRATED PASSIVE DEVICE IN A VIA

(71) Applicant: Taiwan Semiconductor Manufacturing Company, Ltd., Hsinchu (TW)

(72) Inventors: Ching-Wen Hsiao, Hsinchu (TW); Chen-Shien Chen, Zhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,881

(22) Filed: Dec. 3, 2019

(65) Prior Publication Data

US 2020/0105728 A1 Apr. 2, 2020

Related U.S. Application Data

(60) Continuation of application No. 16/229,661, filed on Dec. 21, 2018, now Pat. No. 10,515,938, which is a (Continued)

(51) Int. Cl.
*H01L 25/10* (2006.01)
*H01L 23/14* (2006.01)
(Continued)

(52) U.S. Cl.
CPC .......... *H01L 25/105* (2013.01); *H01L 21/486* (2013.01); *H01L 21/4853* (2013.01);
(Continued)

(58) Field of Classification Search
CPC ........... H01L 23/49827; H01L 23/5384; H01L 21/4846–4867; H01L 21/4807–481;
(Continued)

(56) References Cited

U.S. PATENT DOCUMENTS 5,600,541 A 2/1997 Bone et al.
5,977,640 A 11/1999 Bertin et al.
(Continued)

FOREIGN PATENT DOCUMENTS

CN 101315924 A 12/2008
CN 102034718 A 4/2011
(Continued)

OTHER PUBLICATIONS

Cheah, Bok Eng, et al., "A Novel Inter-Package Connection for Advanced Package-on-Package Enabling," IEEE Electronic Components and Technology Conference, May 31, 2011—Jun. 3, 2011, pp. 589-594.
(Continued)

*Primary Examiner* — Changhyun Yi
(74) *Attorney, Agent, or Firm* — Slater Matsil, LLP

(57) ABSTRACT

A package for a use in a package-on-package (PoP) device and a method of forming is provided. The package includes a substrate, a polymer layer formed on the substrate, a first via formed in the polymer layer, and a material disposed in the first via to form a first passive device. The material may be a high dielectric constant dielectric material in order to form a capacitor or a resistive material to form a resistor.

20 Claims, 4 Drawing Sheets

Related U.S. Application Data continuation of application No. 15/477,941, filed on Apr. 3, 2017, now Pat. No. 10,163,873, which is a division of application No. 13/435,809, filed on Mar. 30, 2012, now Pat. No. 9,613,917.

(51) Int. Cl.

| | | |
|---|---|---|
| *H01L 21/48* | (2006.01) | |
| *H01L 23/64* | (2006.01) | |
| *H01L 49/02* | (2006.01) | |
| *H01L 23/498* | (2006.01) | |
| *H01L 23/538* | (2006.01) | |
| *H01L 21/56* | (2006.01) | |
| *H01L 23/00* | (2006.01) | |
| *H01L 25/00* | (2006.01) | |

(52) U.S. Cl.
CPC .......... *H01L 21/56* (2013.01); *H01L 23/147* (2013.01); *H01L 23/49822* (2013.01); *H01L 23/49827* (2013.01); *H01L 23/5389* (2013.01); *H01L 23/642* (2013.01); *H01L 23/647* (2013.01); *H01L 24/16* (2013.01); *H01L 24/32* (2013.01); *H01L 24/73* (2013.01); *H01L 25/50* (2013.01); *H01L 28/20* (2013.01); *H01L 28/60* (2013.01); *H01L 23/49816* (2013.01); *H01L 28/90* (2013.01); *H01L 2224/16227* (2013.01); *H01L 2224/16235* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06565* (2013.01); *H01L 2225/1023* (2013.01); *H01L 2225/1035* (2013.01); *H01L 2225/1041* (2013.01); *H01L 2225/1058* (2013.01); *H01L 2924/15311* (2013.01); *H01L 2924/19041* (2013.01); *H01L 2924/19105* (2013.01)

(58) Field of Classification Search
CPC .............. H01L 25/105; H01L 21/4853; H01L 23/49822
See application file for complete search history.

(56) References Cited

U.S. PATENT DOCUMENTS

| | | | |
|---|---|---|---|
| 6,153,290 A | 11/2000 | Sunahara | |
| 6,281,046 B1 | 8/2001 | Lam | |
| 6,335,565 B1 | 1/2002 | Miyamoto et al. | |
| 7,105,920 B2 | 9/2006 | Su et al. | |
| 7,545,047 B2 | 6/2009 | Bauer et al. | |
| 7,573,136 B2 | 8/2009 | Jiang et al. | |
| 7,619,901 B2 | 11/2009 | Eichelberger et al. | |
| 7,795,721 B2 | 9/2010 | Kurita | |
| 7,838,337 B2 | 11/2010 | Marimuthu et al. | |
| 7,969,009 B2 | 6/2011 | Chandrasekaran | |
| 8,093,722 B2 | 1/2012 | Chen | |
| 8,097,490 B1 | 1/2012 | Pagaila et al. | |
| 8,105,875 B1 | 1/2012 | Hu et al. | |
| 8,138,014 B2 | 3/2012 | Chi et al. | |
| 8,143,097 B2 | 3/2012 | Chi et al. | |
| 8,263,439 B2 | 9/2012 | Marimuthu et al. | |
| 8,293,580 B2 | 10/2012 | Kim et al. | |
| 8,361,842 B2 | 1/2013 | Yu et al. | |
| 8,435,835 B2 | 5/2013 | Pagaila et al. | |
| 8,476,769 B2 | 7/2013 | Chen et al. | |
| 8,503,186 B2 | 8/2013 | Lin et al. | |
| 8,508,045 B2 | 8/2013 | Khan et al. | |
| 8,604,568 B2 | 12/2013 | Stacey | |
| 8,710,657 B2 | 4/2014 | Park et al. | |
| 8,736,035 B2 | 5/2014 | Hwang et al. | |
| 8,754,514 B2 | 6/2014 | Yu et al. | |
| 8,791,016 B2 | 7/2014 | Gambino et al. | |
| 8,841,748 B2 | 9/2014 | Joblot et al. | |
| 8,872,319 B2 | 10/2014 | Kim et al. | |
| 8,928,114 B2 | 1/2015 | Chen et al. | |
| 8,957,525 B2 | 2/2015 | Lyne et al. | |
| 8,975,726 B2 | 3/2015 | Chen et al. | |
| 9,048,306 B2 | 6/2015 | Chi et al. | |
| 9,087,832 B2 | 7/2015 | Huang et al. | |
| 9,087,835 B2 | 7/2015 | Sutardja et al. | |
| 9,373,527 B2 | 6/2016 | Yu et al. | |
| 9,455,313 B1 | 9/2016 | Christensen et al. | |
| 9,768,048 B2 | 9/2017 | Lin et al. | |
| 10,515,938 B2 * | 12/2019 | Hsiao | H01L 28/20 |
| 2002/0117743 A1 | 8/2002 | Nakatani et al. | |
| 2003/0001240 A1 | 1/2003 | Whitehair et al. | |
| 2003/0116856 A1 | 6/2003 | Tomsio et al. | |
| 2003/0219969 A1 | 11/2003 | Saito et al. | |
| 2004/0095734 A1 | 5/2004 | Nair | |
| 2004/0187297 A1 | 9/2004 | Su et al. | |
| 2004/0256731 A1 | 12/2004 | Mao et al. | |
| 2006/0043549 A1 | 3/2006 | Hsu | |
| 2006/0063312 A1 | 3/2006 | Kurita | |
| 2006/0133056 A1 | 6/2006 | Wyrzykowska et al. | |
| 2007/0161266 A1 | 7/2007 | Nishizawa | |
| 2007/0181974 A1 | 8/2007 | Coolbaugh et al. | |
| 2008/0006936 A1 | 1/2008 | Hsu | |
| 2008/0142976 A1 | 6/2008 | Kawano | |
| 2008/0220563 A1 | 9/2008 | Karnezos | |
| 2008/0277800 A1 | 11/2008 | Hwang et al. | |
| 2009/0057862 A1 | 3/2009 | Ha et al. | |
| 2009/0155957 A1 | 6/2009 | Chen et al. | |
| 2009/0230535 A1 | 9/2009 | Otremba et al. | |
| 2010/0112756 A1 | 5/2010 | Amrine et al. | |
| 2010/0127345 A1 | 5/2010 | Sanders et al. | |
| 2010/0133704 A1 | 6/2010 | Marimuthu et al. | |
| 2010/0140779 A1 * | 6/2010 | Lin | H01L 23/5389 257/690 |
| 2010/0155126 A1 | 6/2010 | Kunimoto et al. | |
| 2010/0155922 A1 | 6/2010 | Pagaila et al. | |
| 2010/0230823 A1 | 9/2010 | Ihara | |
| 2010/0237482 A1 | 9/2010 | Yang et al. | |
| 2010/0243299 A1 | 9/2010 | Kariya et al. | |
| 2011/0024902 A1 | 2/2011 | Lin et al. | |
| 2011/0024916 A1 | 2/2011 | Marimuthu et al. | |
| 2011/0037157 A1 | 2/2011 | Shin et al. | |
| 2011/0062592 A1 | 3/2011 | Lee et al. | |
| 2011/0090570 A1 | 4/2011 | DeCusatis et al. | |
| 2011/0156247 A1 | 6/2011 | Chen et al. | |
| 2011/0163391 A1 | 7/2011 | Kinzer et al. | |
| 2011/0163457 A1 | 7/2011 | Mohan et al. | |
| 2011/0186960 A1 | 8/2011 | Wu et al. | |
| 2011/0186977 A1 | 8/2011 | Chi et al. | |
| 2011/0193221 A1 | 8/2011 | Hu et al. | |
| 2011/0204509 A1 | 8/2011 | Lin et al. | |
| 2011/0215464 A1 * | 9/2011 | Guzek | H01L 21/56 257/737 |
| 2011/0241218 A1 | 10/2011 | Meyer et al. | |
| 2011/0260336 A1 | 10/2011 | Kang et al. | |
| 2011/0278736 A1 | 11/2011 | Lin et al. | |
| 2011/0285005 A1 | 11/2011 | Lin et al. | |
| 2012/0032340 A1 * | 2/2012 | Choi | H01L 21/561 257/774 |
| 2012/0038053 A1 * | 2/2012 | Oh | H01L 23/3128 257/773 |
| 2012/0049346 A1 | 3/2012 | Lin et al. | |
| 2012/0056312 A1 | 3/2012 | Pagaila et al. | |
| 2012/0139068 A1 | 6/2012 | Stacey | |
| 2012/0139295 A1 | 6/2012 | Huepperling | |
| 2012/0161315 A1 | 6/2012 | Lin | |
| 2012/0208319 A1 | 8/2012 | Meyer | |
| 2012/0217643 A1 | 8/2012 | Pagaila et al. | |
| 2012/0273960 A1 | 11/2012 | Park et al. | |
| 2012/0319294 A1 * | 12/2012 | Lee | H01L 25/105 257/774 |
| 2012/0319295 A1 | 12/2012 | Chi et al. | |
| 2013/0009322 A1 | 1/2013 | Conn et al. | |
| 2013/0009325 A1 | 1/2013 | Mod et al. | |
| 2013/0044554 A1 | 2/2013 | Goel et al. | |
| 2013/0062760 A1 | 3/2013 | Hung et al. | |

(56) References Cited

U.S. PATENT DOCUMENTS

| | | |
|---|---|---|
| 2013/0062761 A1 | 3/2013 | Lin et al. |
| 2013/0093078 A1 | 4/2013 | Lin et al. |
| 2013/0105991 A1 | 5/2013 | Gan et al. |
| 2013/0111123 A1 | 5/2013 | Thayer |
| 2013/0181325 A1 | 7/2013 | Chen et al. |
| 2013/0182402 A1 | 7/2013 | Chen et al. |
| 2013/0234322 A1 | 9/2013 | Pendse |
| 2013/0256836 A1 | 10/2013 | Hsiao et al. |
| 2013/0307155 A1 | 11/2013 | Mitsuhashi |
| 2013/0334697 A1 | 12/2013 | Shin et al. |
| 2014/0070422 A1 | 3/2014 | Hsiao et al. |
| 2014/0091473 A1 | 4/2014 | Len et al. |
| 2014/0103488 A1 | 4/2014 | Chen et al. |
| 2014/0110856 A1 | 4/2014 | Lin |
| 2014/0183731 A1 | 7/2014 | Lin et al. |
| 2014/0264836 A1 | 9/2014 | Chun et al. |
| 2014/0367828 A1 | 12/2014 | Colonna et al. |
| 2015/0093881 A1 | 4/2015 | Chen et al. |
| 2015/0096798 A1 | 4/2015 | Uzoh |
| 2015/0102464 A1 | 4/2015 | Kang et al. |
| 2015/0115464 A1 | 4/2015 | Yu et al. |
| 2015/0115470 A1 | 4/2015 | Su et al. |
| 2015/0155203 A1 | 6/2015 | Chen et al. |
| 2016/0148991 A1 | 5/2016 | Erickson et al. |
| 2016/0293577 A1 | 10/2016 | Yu et al. |
| 2016/0322330 A1 | 11/2016 | Lin et al. |

FOREIGN PATENT DOCUMENTS

| | | |
|---|---|---|
| CN | 102157391 A | 8/2011 |
| KR | 20110025699 A | 3/2011 |
| KR | 101099578 B1 | 12/2011 |
| KR | 20120060486 A | 6/2012 |
| KR | 1020120075855 A | 7/2012 |
| KR | 1020120094182 A | 8/2012 |
| KR | 1020120098844 A | 9/2012 |
| TW | 200919632 | 5/2009 |
| TW | 201230266 A | 7/2012 |
| WO | 2011090570 A2 | 7/2011 |

OTHER PUBLICATIONS

Zhang, et al., "Lead-Free Bumping and Its Challenges," IWPLC Conference Proceedings, Oct. 10, 2004, 8 pgs.

\* cited by examiner

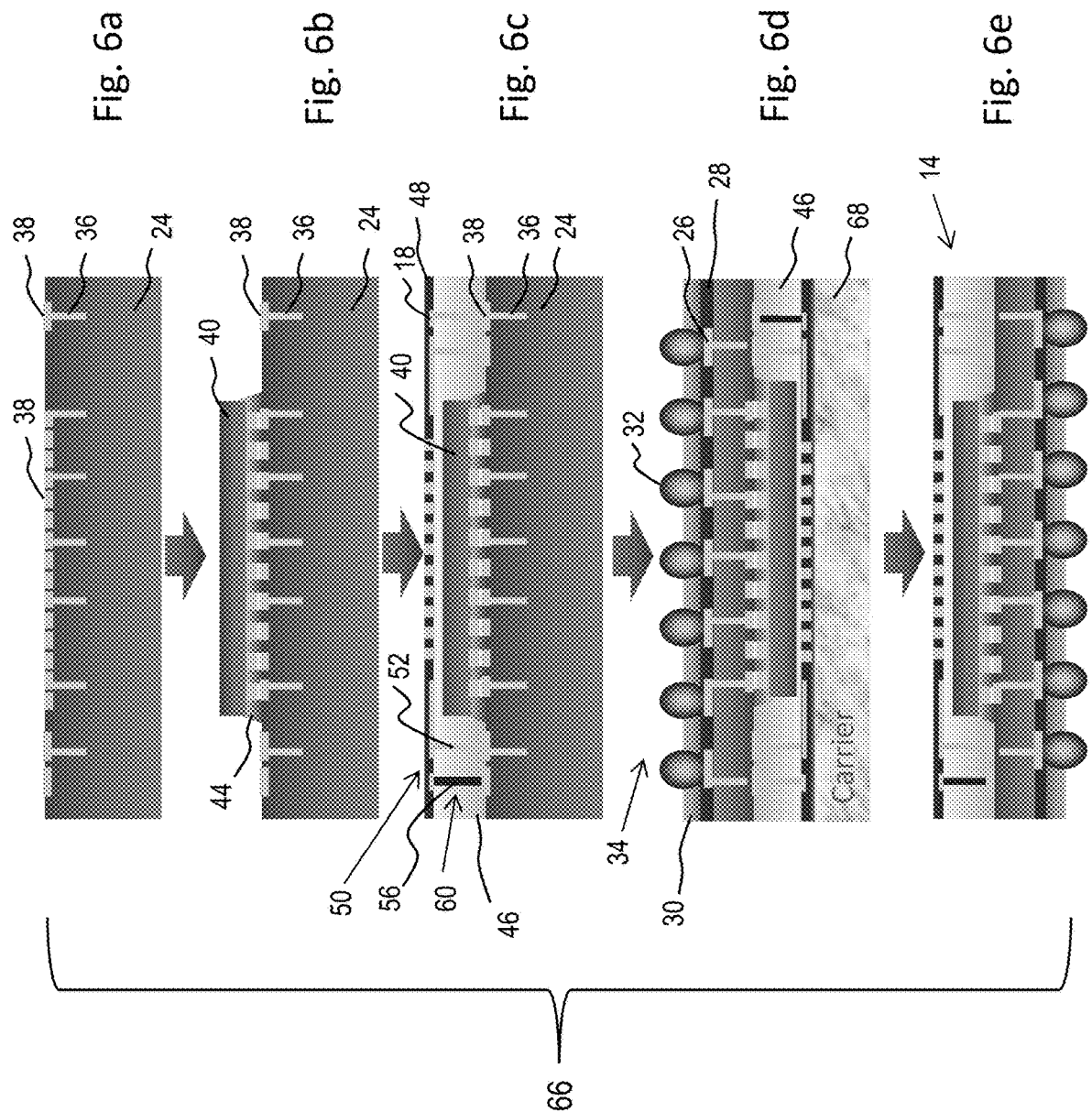

PACKAGE-ON-PACKAGE (POP) DEVICE WITH INTEGRATED PASSIVE DEVICE IN A VIA

This application is a continuation of U.S. patent application Ser. No. 16/229,661, filed Dec. 21, 2018, entitled "Package-on-Package (PoP) Device with Integrated Passive Device in a Via," which is a continuation of U.S. patent application Ser. No. 15/477,941, filed Apr. 3, 2017, entitled "Package-on-Package (PoP) Device with Integrated Passive Device in a Via," now U.S. Pat. No. 10,163,873 issued on Dec. 25, 2018, which is a divisional of U.S. patent application Ser. No. 13/435,809, filed Mar. 30, 2012, entitled "Package-on-Package (PoP) Device with Integrated Passive Device in a Via," now U.S. Pat. No. 9,613,917 issued on Apr. 4, 2017, which applications are incorporated herein by reference in their entireties.

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic ball grid array (BGA) packages. In PoP package designs, the top package may be interconnected to the bottom package through peripheral solder balls.

Another packaging technique that has been developed is Fan-in Package-on-Package (FiPoP). A Fi-PoP device may incorporate multiple logic, analog, and memory devices in the bottom package. The Fi-PoP device structure permits smaller top packages (e.g., memory packages) to be mounted to the bottom package using center ball grid array patterns on the top package.

Because of the desire to continually reduce the size and height of PoP devices, the available space between the top and bottom packages is extremely limited.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 6a-6e collectively illustrate an embodiment of a process of forming the FiPoP device of FIG. 1.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a Fan-in Package-on-Package (FiPoP) semiconductor device. The concepts in the disclosure may also apply, however, to other semiconductor structures or circuits.

Figure 1:
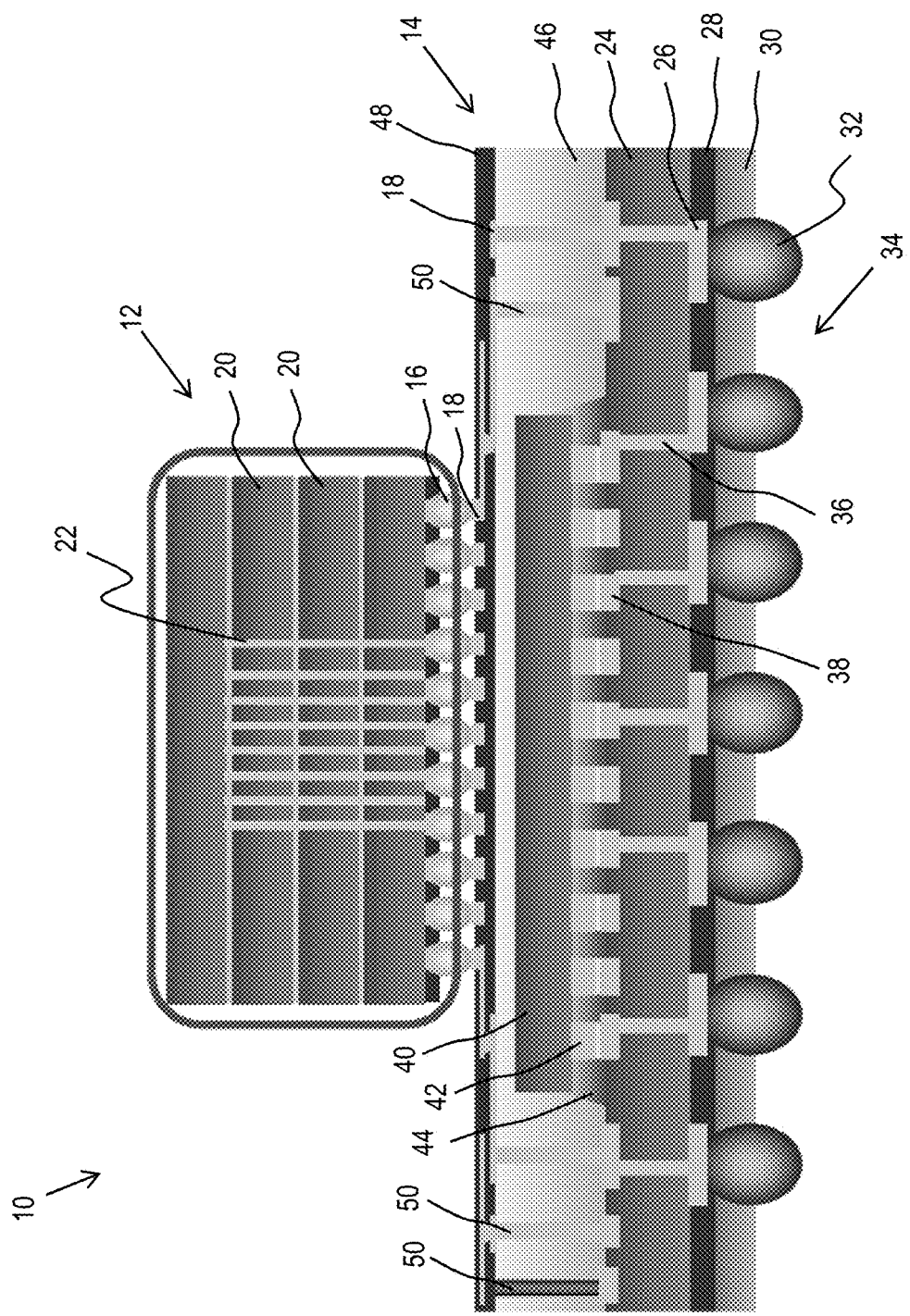
FIG. 1 is a cross section of an embodiment of a fan-in package-on-package (FiPoP) device.

Referring concurrently to FIG. 1, an embodiment FiPoP device 10 is illustrated. As will be more fully explained below, the FiPoP device 10 provides an innovative package-on-package structure with integrated, or built-in, passive devices. As such, the FiPoP device 10 offers improved electrical performance and a higher operation frequency relative to a conventional FiPoP device or a standard Package-on-Package (PoP) device. As shown in FIG. 1, the FiPoP device 10 generally includes a top package 12 coupled to a bottom package 14 through a center ball grid array 16 and corresponding contacts 18.

In an embodiment, the top package 12 includes several stacked memory chips 20. The memory chips 20 may be electrically coupled to each other through, for example, wire bonds 22. While several memory chips 20 are depicted in FIG. 1, in an embodiment the top package 12 may include a single memory chip 20. The top package 12 may also incorporate other chips, dies, or electronic circuitry depending on the intended use or performance needs of the FiPoP device 10.

The bottom package 14 includes a substrate 24 formed from a suitable semiconductor material (e.g., silicon, etc.). The substrate 24 generally includes and supports an under bump metallization (UBM) 26, a first passivation layer 28, and a molding layer 30. The UMB 26 is configured to engage with solder balls 32 from a ball grid array (BGA) 34. The BGA 34 may be employed to mount the FiPoP device 10 to, for example, a circuit board or another electronic device.

The first passivation layer 28 generally protects the substrate 22 and encapsulates the UBM 26. The first passivation layer 28 may be formed from, for example, a passivating oxide, silicon nitride (SiN), silicon nitrogen oxide (SiNOx), or silicon oxide (SiOx). Other layers, such as a polymeric layer formed from polybenzoxaxole, may be used in addition to, or instead of, the first passivation layer 28. The molding layer 30 overlies the first passivation layer 28 and is disposed adjacent to the solder balls 32. The molding layer 30 may be formed from a variety of suitable molding compounds.

Still referring to FIG. 1, the bottom package 14 includes numerous metal interconnections 36 formed through the substrate 24. The metal interconnections 36 extend between, and electrically couple, the UBM 26 to contacts 38 embedded in or supported by an upper portion of the substrate 24. In an embodiment, the contacts 38 are used to mount a die 40 (e.g., a logic integrated circuit, an analog device, etc.) to the substrate 24. In an embodiment, the die 40 (i.e., a chip) is mounted on the substrate 24 (e.g., a semiconductor wafer) using solder connections 42 formed during a chip-on-wafer (CoW) bonding process. As shown in FIG. 1, an underfill material 44 may be flowed between the die 40 and the substrate 24 in order to encapsulate the solder connections 42.

The bottom package 14 also includes a lamination layer 46 disposed on the substrate 24. The lamination layer 46 generally encapsulates the die 40 and may be formed from a polymer (e.g., an organic polyimide, lead oxide, an epoxy, etc.) or a photodielectric. As shown in FIG. 1, the lamination layer 46 also supports a second passivation layer 48.

The second passivation layer 48 may be formed from a passivating oxide, silicon nitride (SiN), silicon nitrogen oxide (SiNOx), or silicon oxide (SiOx). Other layers, such as a polymeric layer formed from polybenzoxaxole, may be used in addition to, or instead of, the second passivation layer 48. Still referring to FIG. 1, additional contacts 18 are disposed within the second passivation layer 48. As noted above, some of the contacts 18 are employed to mount the top package 12. Some of the other contacts 18 embedded or supported by the second passivation layer 48 are formed over vias 50 that have been formed in the lamination layer 46.

Figure 2:
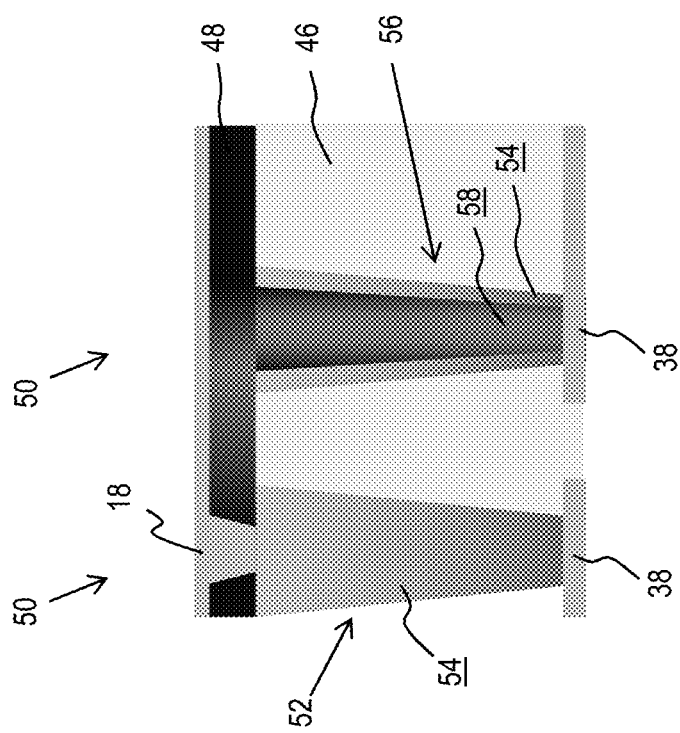
FIG. 2 is a representative portion of the FiPoP device of FIG. 1 highlighting two of the vias in the FiPoP device.

Referring now to FIG. 2, which represents and highlights a portion of the PoP device 10 of FIG. 1, two of the vias 50 are illustrated in greater detail. As shown in FIG. 2, a first via 52 has been plated with metal 54. As such, the first via 52 forms an electrical interconnection between one of the contacts 18 embedded in the second passivation layer 48 and one of contacts 38 embedded in the substrate 24 (FIG. 1). In an embodiment, the first via 52 is plated with copper or another highly conductive metal.

Still referring to FIG. 2, a second via 56 is plated with metal 54 and then filled with a dielectric material 58. In an embodiment, the dielectric material 58 is a material with a high dielectric constant compared to silicon dioxide ($SiO_2$) such as, for example, hafnium silicate ($HfSiO_4$), zirconium silicate ($ZrSiO_4$), hafnium dioxide ($HfO_2$), zirconium dioxide ($ZrO_2$), yttrium oxide ($Y_2O_3$), aluminum oxide ($Al_2O_3$), and the like. Other dielectric materials may also be used in other embodiments.

Figure 3:
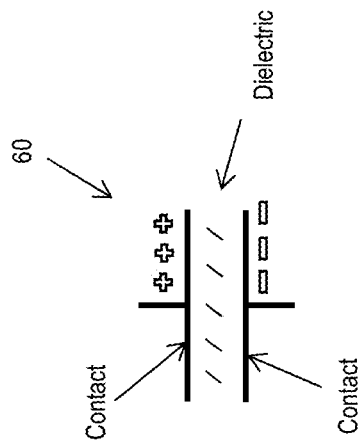
FIG. 3 is a simplified circuit model for a capacitor formed in one of the vias of FIG. 2.

As shown in FIG. 2, a top surface of the dielectric material 58 in the second via 56 engages or encounters a non-conducting material such as, for example, the second passivation layer 48 disposed under the contact 18. In contrast, a bottom surface of the dielectric material 58 in the second via 56 engages one of contacts 38 embedded in the substrate 24. In this configuration, the second via 56 forms a high volume capacitor 60 as shown in FIG. 3. Referring collectively to FIGS. 2 and 3, the contact 18 generally forms the top plate or contact while the contact 38 and the metal 54 plated sidewalls of the via 56 form the bottom plate or contact of the capacitor 60.

In an embodiment, several the second vias 56 in the bottom package 14 are filled with the dielectric material 58 to form a plurality of capacitors 60 depicted in FIG. 3. In an embodiment, one or more of the capacitors 60 in the plurality are electrically coupled together. In an embodiment, the capacitors 60 in the plurality may be directly horizontally adjacent to one another. In an embodiment, the capacitors 60 may be spaced apart from each other by one or more of the first vias 52 functioning as an interconnect. In an embodiment, some of the second vias 56 are filled with a different dielectric material 58 relative to other second vias 56. Therefore, one of the capacitors 60 in the bottom package 14 may provide a different capacitance relative to another of the capacitors 60 in the bottom package.

Figure 4:
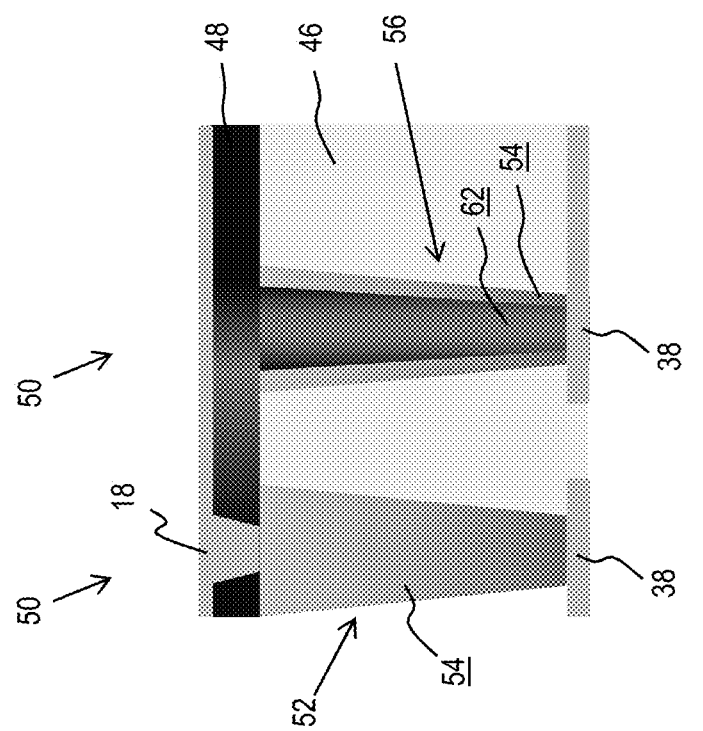
FIG. 4 is a representative portion of an embodiment of another FiPoP device highlighting two of the vias in the FiPoP device.
Figure 5:
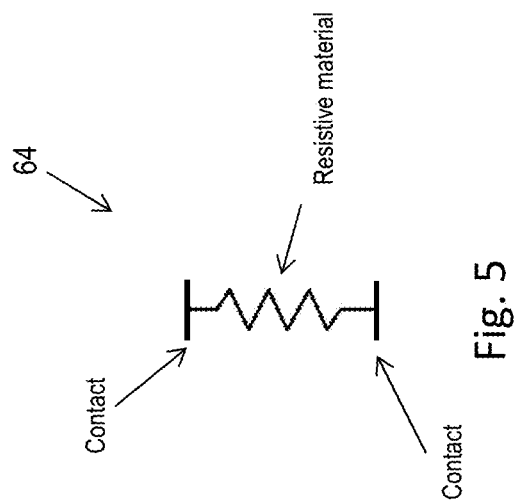
FIG. 5 is a simplified circuit model for a resistor formed in one of the vias of FIG. 4.

Referring collectively to FIGS. 4-5, in an embodiment the second vias 56 in the bottom package 14 of the PoP device 10 are filled with a resistive material 62 (instead of a dielectric material 58) in order to form a resistor 64. In an embodiment, the resistive material 62 may be formed from carbon, a carbon composition, a ceramic, a metal oxide (e.g., tin oxide), and the like. In an embodiment, some of the second vias 56 are filled with a different resistive material 62 relative to other second vias 56. Therefore, one of the resistors 64 in the bottom package 14 may provide a different resistance relative to another capacitor 64 in the bottom package.

Referring collectively to FIGS. 6a-6e, an embodiment of a process 66 for forming the FiPoP device 10 of FIG. 1 is sequentially illustrated. As shown in FIG. 6a, the substrate 24 (e.g., a silicon wafer) is subjected to a through silicon via (TSV) process to generate vias in the substrate 24. Once the vias have been formed, an electroplating process is initiated to plate the vias with, for example, copper. These copper-plated vias form the interconnections 36 in the substrate 24. After the vias in the substrate 24 have been plated, a back end of line (BEOL) scheme is implemented to electrically connect the copper-plated vias and to form the contacts 38. The copper-plated vias may be used to interconnect components of the top package 12 and components of the bottom package 14 (FIG. 1). Thereafter, in an embodiment a testing process is performed to ensure that the circuits formed by BEOL scheme are acceptable.

Moving now to FIG. 6b, the die 40 (e.g., a memory chip) is coupled to the substrate 24 through a chip-on-wafer (CoW) bonding process. In an embodiment, the chip 40 is coupled to the substrate 24 using a flip-chip bumping or other chip bonding process. Thereafter, the underfill 44 material is flowed or otherwise introduced in between the die 40 and the substrate 24.

Next, as shown in FIG. 6c, a lamination process is performed to generate a lamination layer 46 over the chip 40 and a top surface of the substrate 24 adjacent to the chip 40. In an embodiment, the lamination layer 46 is formed from a dielectric material such as a polymer (e.g., an organic polyimide, an epoxy, etc.), lead oxide, or a photodielectric. In an embodiment, the lamination layer 46 completely encapsulates the die 40.

Thereafter, the vias 50 are formed through the lamination layer 46 using, for example, a photo exposure process. Once the vias 50 have been formed, a deep trench plating process is employed to plate an exposed interior surface of the vias 50 with metal 54 (FIG. 2). In an embodiment, the deep trench plating process plates these vias 50 with a conductive metal 54 such as, for example, copper. In another embodiment, other conductive metals or alloys may be used to suitably plate the vias 50. One or more of the plated vias 50 may be electrically coupled together during the plating process. In an embodiment, all of the vias 50 are copper-plated during the plating process. In another embodiment, only some of the vias 50 are copper plated.

Still referring to FIG. 6c, in an embodiment some of the vias 50 (e.g., the second via 56) are filled with the dielectric material 58 (FIG. 2) in order to form high volume capacitors 60 (a single capacitor is shown in FIG. 6c). In an embodiment, a stencil printing process is employed to fill some of the vias 50 with the dielectric material 56. In an embodiment, the stencil printing process is also used to generate a layer of dielectric material over the contacts 18 and upon the lamination layer 46 (FIG. 2).

As shown in FIG. 6c, the capacitor 60 is embedded within what will eventually become the bottom package 14 of the FiPoP device 10 of FIG. 1. In an embodiment, another other passive device (e.g., a resistor) may be formed in one or more of the vias 50 by filling the vias with an appropriate resistive material 62 (e.g., carbon, a ceramic, etc.) instead of with the dielectric material 58.

In an embodiment, the capacitor 60 may be horizontally adjacent to one of the vias 50 that has not been filed with dielectric material (i.e., a copper-plated via 50 functioning as an interconnection) as shown in FIG. 2. In another embodiment, however, the capacitor 60 may be horizontally adjacent to another one of the capacitors 60 formed using the above described process. Indeed, several of the capacitors 60 may be situated side-by-side or otherwise arranged depending on the requirements of the bottom package 14 or the FiPoP device 10. In an embodiment, where several of the capacitors 60 are formed in the bottom package 14 of the FiPoP device 10, each of the capacitors 60 may offer the same capacitance (e.g., $C_1$=0.2 pico Farard (pF), $C_2$=0.2 pF, $C_3$=0.2 pF, etc.). In another embodiment, each of the capacitors 60 may have different capacitances (e.g., $C_1$=0.1 pF, $C_2$=0.2 pF, $C_3$=0.4 pF, etc.). In an embodiment, several of the capacitors 60 may be electrically coupled together to form a bank of capacitors.

The capacitors 60 formed as noted above are able to reduce the resistive-capacitive (RC) delay of the FiPoP device 10 relative to when distant capacitors (e.g., capacitors not incorporated into the FiPoP device 10) are used. The capacitors 60 are also able to reduce the signal rising/falling time of the FiPoP device 10.

After the vias 50 have been filled with the dielectric material 62 to form the capacitors 60 and/or copper plated to form interconnections or other electric circuitry, a redistribution layer (RDL) process is performed to generate a desired pattern of contacts 18 and/or metallization on or in a top surface of the lamination layer 46. As shown, the redistribution layer process generates the contacts 18 used to receive the center ball grid array (BGA) 16 of the top package 12 shown in FIG. 1. In an embodiment, a passivation process may be performed to generate the passivation layer 48 on the substrate 24 and around the contacts 18.

Referring now to FIG. 6d, a carrier bonding process is performed to temporarily bond a carrier 68 to the redistribution layer 46. The carrier 68 is used to effectively move and position the entire assembly for further processing. In an embodiment, the assembly is inverted using the carrier 68 and a backside thinning process is performed to remove a portion of the substrate 24 and to expose the metal interconnections 36. Once the metal interconnections 36 have been exposed, another RDL process and an under bump metallization (UBM) process are performed to provide the UBM 26 configured to receive solder balls 32 from the ball grid array 34. The ball grid array 34 may be employed to electrically couple the FiPoP device 10 to a circuit board or another electronic device. In an embodiment, a passivation process may be performed to generate the passivation layer 28 on the substrate 24 and over the contacts 26. In addition, in an embodiment a molding process may be performed to form the molding layer 30 over the passivation layer and around a portion of the solder balls 32.

Referring now to FIG. 6e, a carrier de-bonding process is performed to remove the carrier 68. Once the carrier 68 has been removed, a singulation process is performed generate individual bottom packages 14. Finally, a known good package (KGP) process is performed to test the packages 14.

Based on the above, those skilled in the art will recognize that the FiPoP device 10 provides an innovative package on package structure with built-in integrated passives. Therefore, performance of the FiPoP device 10 is increased. In addition, operational frequency for the FiPoP device 10 is higher.

A package for a use in a package-on-package (PoP) device. The PoP device comprises a substrate, a polymer layer formed on the substrate, a first via formed in the polymer layer, and a material disposed in the first via to form a first passive device.

A package-on-package (PoP) device comprises a top package and a bottom package operably coupled to the top package. The bottom package includes a substrate supporting a polymer layer. The polymer layer includes a first via filled with a first material to form a first passive device.

A method of forming a package for a use in a package-on-package (PoP) device. The method comprises forming a polymer layer on a substrate, forming a first via in the polymer layer, and filling the first via with a material to form a passive device.

In an embodiment, a package includes a substrate, a first contact on a first side of the substrate, a die bonded to the first side of the substrate, an encapsulant over substrate and encapsulating the first contact and the die; a first column of a first material extending through the encapsulant. A first surface of the first column is in physical contact with the first contact. The package further includes a liner of a second material lining sidewalls of the first column, a passivation layer over the encapsulant, and a second contact over the first column. The second material is more conductive than the first material. The passivation layer is in physical contact with a second surface of the first column. The second surface of the first column is opposite the first surface of the first column. The passivation layer is interposed between the first column and the second contact.

In another embodiment, a package includes a die encapsulated in an encapsulant, the encapsulant having a first side and a second side opposite the first side, a first column of a first material extending from the first side of the encapsulant to the second side of the encapsulant, and a liner of a second material extending along sidewalls of the first column. The second material is less resistive than the first material. The package further includes a first contact on the first side of the encapsulant, a second contact on the second side of the encapsulant, and an insulating layer on the second side of the encapsulant and in physical contact with the first material and the second material. The first contact is in physical contact with the first material and the second material. The insulating layer is interposed between the second contact and the first column.

In yet another embodiment, a package includes a substrate, a first contact and a second contact on a first side of the substrate, a die bonded to the first side of the substrate, an encapsulant over substrate and extending along sidewalls of the die, and a first column of a first material extending through the encapsulant. The first surface of the first column is in physical contact with the first contact. The package further includes a second column of a second material extending through the encapsulant, a liner of the first material lining sidewalls of the second column, a passivation layer over the encapsulant, and a second contact over the passivation layer. The first surface of the second column is in physical contact with the second contact. The second material is less conductive than the first material. The passivation layer is in physical contact with a second surface of the first column and a second surface of the second column. The second surface of the first column is opposite the first surface of the first column. The second surface of the second column is opposite the first surface of the second column. A portion of the second contact extends through the passivation layer and physically contacts the second surface of the first column.

In yet another embodiment, a package includes a die encapsulated in a polymer layer. The polymer layer has a first side and a second side opposite the first side. A first pillar of a first material extends from the first side of the polymer layer to the second side of the polymer layer. A liner of a second material extends along sidewalls of the first pillar. The second material is less resistive than the first material. An insulating layer is on the second side of the polymer layer and is in physical contact with the first material and the second material.

In yet another embodiment, a package includes a substrate. A first contact is on a first side of the substrate. A die is attached to the first side of the substrate. A polymer layer is over substrate and the first contact. The polymer layer extends along sidewalls of the die. A dielectric pillar extends through the polymer layer. A first surface of the dielectric pillar is in physical contact with the first contact. A conductive liner lines a sidewall of the dielectric pillar. A passivation layer is over the polymer layer. The passivation layer is in physical contact with a second surface of the dielectric pillar. The second surface of the dielectric pillar is opposite to the first surface of the dielectric pillar.

In yet another embodiment, a package includes a substrate. A first contact is on a first side of the substrate. A polymer layer is over the substrate and the first contact. A die is embedded in the polymer layer. A resistive pillar is embedded in the polymer layer. A first surface of the resistive pillar is in physical contact with the first contact. A conductive liner extends along a sidewall of the resistive pillar. A passivation layer is over the polymer layer. The passivation layer is in physical contact with a second surface of the resistive pillar and the conductive line. The second surface of the resistive pillar is opposite to the first surface of the resistive pillar.

While the disclosure has been provided with reference to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A package comprising:
a die encapsulated in a polymer layer, the polymer layer having a first side and a second side opposite the first side;
a first pillar of a first material extending from the first side of the polymer layer to the second side of the polymer layer;
a liner of a second material extending along sidewalls of the first pillar, wherein the second material is less resistive than the first material; and
an insulating layer on the second side of the polymer layer and in physical contact with the first material and the second material.

2. The package of claim 1, wherein the first material comprises carbon, a carbon composition, a ceramic, or a metal oxide.

3. The package of claim 1, wherein the first material comprises hafnium silicate (HfSiO$_4$), zirconium silicate (ZrSiO$_4$), hafnium dioxide (HfO$_2$), zirconium dioxide (ZrO$_2$), yttrium oxide (Y$_2$O$_3$), or aluminum oxide (Al$_2$O$_3$).

4. The package of claim 1, further comprising:
a first contact on the first side of the polymer layer, the first contact being in physical contact with the first material and the second material; and
a second contact on the second side of the polymer layer, wherein the insulating layer is interposed between the second contact and the first pillar.

5. The package of claim 4, further comprising a second pillar of the second material extending from the first side of the polymer layer to the second side of the polymer layer.

6. The package of claim 5, wherein the second contact is in physical contact with the second pillar.

7. The package of claim 1, wherein the first pillar has a sloped sidewall.

8. A package comprising:
a substrate;
a first contact on a first side of the substrate;
a die attached to the first side of the substrate;
a polymer layer over substrate and the first contact, the polymer layer extending along sidewalls of the die;
a dielectric pillar extending through the polymer layer, a first surface of the dielectric pillar being in physical contact with the first contact;
a conductive liner lining a sidewall of the dielectric pillar; and
a passivation layer over the polymer layer, the passivation layer being in physical contact with a second surface of the dielectric pillar, the second surface of the dielectric pillar being opposite to the first surface of the dielectric pillar.

9. The package of claim 8, further comprising a second contact over the dielectric pillar, wherein the passivation layer is interposed between the dielectric pillar and the second contact.

10. The package of claim 9, further comprising a conductive pillar extending through the polymer layer.

11. The package of claim 10, wherein a portion of the second contact extends through the passivation layer and physically contacts the conductive pillar.

12. The package of claim 10, further comprising a third contact on the first side of the substrate, wherein the conductive pillar is in physical contact with the third contact.

13. The package of claim 8, wherein the dielectric pillar comprises hafnium silicate (HfSiO$_4$), zirconium silicate (ZrSiO$_4$), hafnium dioxide (HfO$_2$), zirconium dioxide (ZrO$_2$), yttrium oxide (Y$_2$O$_3$), or aluminum oxide (Al$_2$O$_3$).

14. The package of claim 8, wherein the passivation layer is in physical contact with the conductive liner.

15. A package comprising:
a substrate;
a first contact on a first side of the substrate;
a polymer layer over the substrate and the first contact;
a die embedded in the polymer layer;
a resistive pillar embedded in the polymer layer, wherein a first surface of the resistive pillar is in physical contact with the first contact;
a conductive liner extending along a sidewall of the resistive pillar; and
a passivation layer over the polymer layer, wherein the passivation layer is in physical contact with a second surface of the resistive pillar and the conductive line, and wherein the second surface of the resistive pillar is opposite to the first surface of the resistive pillar.

16. The package of claim 15, further comprising a conductive pillar embedded in the polymer layer adjacent the resistive pillar.

17. The package of claim 16, wherein the conductive pillar and the conductive liner comprise copper.

18. The package of claim 16, further comprising a second contact over the resistive pillar, wherein a portion of the passivation layer is interposed between the second surface of the resistive pillar and the second contact, and wherein a portion of the second contact extends through the passivation layer and physically contacts the conductive pillar.

19. The package of claim 15, wherein the resistive pillar comprises carbon, a carbon composition, a ceramic, or a metal oxide.

20. The package of claim 15, wherein the passivation layer comprises a passivating oxide, silicon nitride (SiN), silicon nitrogen oxide (SiNOx), or silicon oxide (SiOx).

* * * * *